United States Patent
Parkhurst et al.

(10) Patent No.: US 9,571,051 B2
(45) Date of Patent: Feb. 14, 2017

(54) REDUCING COMMON MODE TRANSCONDUCTANCE IN INSTRUMENTATION AMPLIFIERS

(71) Applicant: Texas Instruments Incorporated, Dallas, TX (US)

(72) Inventors: Charles Parkhurst, Murphy, TX (US); Hector Torres, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/674,220

(22) Filed: Mar. 31, 2015

(65) Prior Publication Data

US 2015/0288337 A1    Oct. 8, 2015

Related U.S. Application Data

(60) Provisional application No. 61/974,127, filed on Apr. 2, 2014.

(51) Int. Cl.
*H03F 3/04*   (2006.01)
*H03F 3/45*   (2006.01)

(52) U.S. Cl.
CPC ...... *H03F 3/45928* (2013.01); *H03F 3/45179* (2013.01); *H03F 3/45475* (2013.01); *H03F 3/45632* (2013.01); *H03F 2200/261* (2013.01); *H03F 2203/45116* (2013.01); *H03F 2203/45522* (2013.01); *H03F 2203/45528* (2013.01)

(58) Field of Classification Search
CPC .......................................................... H03F 3/04
USPC .................... 330/253, 296, 69, 147, 148
See application file for complete search history.

(56) References Cited

U.S. PATENT DOCUMENTS

| | | | | |
|---|---|---|---|---|
| 3,327,235 A | * | 6/1967 | Hull | H03F 1/083 330/100 |
| 6,011,436 A | * | 1/2000 | Koike | H03F 1/3211 330/253 |
| 7,075,353 B1 | * | 7/2006 | Wan | G06F 1/04 327/295 |
| 7,119,612 B1 | * | 10/2006 | Holloway | H03F 1/02 330/253 |
| 8,319,553 B1 | * | 11/2012 | Ivanov | H03F 1/223 330/253 |
| 2011/0254626 A1 | * | 10/2011 | Harada | H03F 3/45179 330/261 |
| 2012/0049958 A1 | * | 3/2012 | Takei | H03F 3/45197 330/258 |

* cited by examiner

*Primary Examiner* — Patricia T Nguyen
(74) *Attorney, Agent, or Firm* — Gregory J. Albin; Charles A. Brill; Frank D. Cimino (57) ABSTRACT

An instrumentation amplifier (INA) that includes a first amplifier and a second amplifier coupled to the first amplifier. The first amplifier includes a first transistor. The first amplifier is configured to receive a positive phase signal of a differential signal. The second amplifier includes a second transistor and is configured to receive a negative phase signal of the differential signal. The first and second transistors each include a gate, source, and drain. The first transistor drain is connected to the second transistor drain.

20 Claims, 6 Drawing Sheets

REDUCING COMMON MODE TRANSCONDUCTANCE IN INSTRUMENTATION AMPLIFIERS

CROSS-REFERENCE TO RELATED APPLICATIONS

The present application claims priority to U.S. Provisional Patent Application No. 61/974,127, filed Apr. 2, 2014, titled "COMMON MODE TRANSCONDUCTANCE REDUCTION TECHNIQUE FOR INSTRUMENTATION AMPLIFIERS," which is hereby incorporated herein by reference in its entirety.

BACKGROUND

Instrumentation amplifiers (INAs) are widely used conditioning circuits that may be utilized to drive analog-to-digital converters (ADCs). Typically, a conventional INA is a voltage feedback amplifier (VFA) that is configured to amplify an input signal by a certain amount of gain. The gain of an INA is typically adjustable to maximize the dynamic range of the ADC. However, when the gain of an INA is increased, the INA's bandwidth decreases resulting in a slower INA. The term for this type of behavior is gain bandwidth product and is a first order limitation of any VFA. Thus, when driving the sampling network of an ADC, an INA's output impedance over frequency increases as the gain increases. This causes increased settling time of the signal being sampled.

SUMMARY

The problems noted above are solved in large part by systems and methods for reducing common mode transconductance in instrumentation amplifiers. In some embodiments, an instrumentation amplifier (INA) includes a first amplifier and a second amplifier coupled to the first amplifier. The first amplifier includes a first transistor. The first amplifier is configured to receive a positive phase signal of a differential signal. The second amplifier includes a second transistor and is configured to receive a negative phase signal of the differential signal. The first and second transistors each include a gate, source, and drain. The first transistor drain is connected to the second transistor drain.

Another illustrative embodiment is a system that includes an INA and an analog-to-digital converter (ADC) coupled to the INA. The INA includes a first amplifier and a second amplifier. The first amplifier includes a first field effect transistor (FET) comprising a gate, source, and drain. The second amplifier includes a second FET comprising a gate, source, and drain. The first FET drain is connected to the second FET drain. The ADC is configured to receive an output signal of the INA.

Yet another illustrative embodiment is an INA that includes a first operational amplifier, a second operational amplifier coupled to the first operational amplifier, a gain resistor coupled to the first and second operational amplifiers, and a plurality of feedback resistors coupled to the first and second operational amplifiers and the gain resistor. The first operational amplifier includes a first p-channel metal-oxide-semiconductor field-effect (PMOS) transistor, a second PMOS transistor, and a first compensation capacitor. The first operational amplifier is configured to receive a common mode signal. The second operational amplifier includes a third PMOS transistor, a fourth PMOS transistor, and a second compensation capacitor. The first PMOS transistor drain is connected to the third PMOS transistor drain and the second PMOS transistor drain is connected to the fourth PMOS transistor drain.

BRIEF DESCRIPTION OF THE DRAWINGS

For a detailed description of exemplary embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Instrumentation amplifiers (INAs) are widely utilized as conditioning circuits to drive analog-to-digital converters (ADCs). Typically, an INA is a voltage feedback amplifier (VFA) fed by a differential signal. A conventional INA may include two amplifiers, two feedback resistors, and a gain resistor. The amplifiers typically include at least two field effect transistors (FET), such as p-channel metal-oxide-semiconductor field-effect (PMOS) transistors, and a compensation capacitor. However, the transistors in each amplifier of the conventional INA are not connected such that one amplifier feeds the other. In order to maximize the ADC's dynamic range, the gain of the INA may be adjustable. However, as the gain of the INA is increased, the bandwidth of a conventional INA decreases resulting in decreased performance of the INA. This limitation is known as gain bandwidth product and is a first order limitation of any VFA.

A potential solution is to decompensate the INA as the gain is increased. This increases the bandwidth of the INA even as the gain is increased. However, in the presence of common mode signals, phase margins may be reduced which makes the INA potentially unstable. This is due to the sharing of resistors in the feedback network by the amplifiers in the INA which causes a gain of one in the presence of common mode signals regardless of the adjustable gain and compensation set in the INA for differential signals. While the INA is typically fed by a differential signal, common mode signals may be present in the INA because the amplifiers in the INA may pick up the same signal triggering oscillation. Thus, there is a need to prevent the decrease in phase margin in the presence of common mode signals in a VFA INA when decompensation is applied while maintaining differential mode performance without increasing power dissipation and die area usage for the circuit.

By reducing common mode transconductance ($GM_C$) without affecting the differential mode transconductance ($GM_D$), a decrease in phase margin in the presence of common mode signals in a VFA INA when decompensation is applied may be prevented while maintaining differential mode performance. Transconductance (GM) in a VFA INA which utilizes metal oxide semiconductor (MOS) transistors in the amplifiers of the INA may be determined by:

$$GM = k'\frac{W}{L}(V_{GS} - V_T)$$

where k' is a technology constant, $$\frac{W}{L}$$

is the channel dimensions of the MOS transistors (sometimes termed the "area"), and ($V_{GS}$-$V_T$) is the amount of overdrive of the MOS transistor. Because the amount of overdrive is fixed in this system, the transconductance in the INA is directly proportional to the area of the transistors.

The bandwidth of the amplifiers within the INA may be determined by:

$$BW = \frac{GM}{2\pi C_C}$$

where $C_c$ is compensation. Therefore, to reduce bandwidth for the amplifiers within the INA, either the compensation may be increased or the transconductance may be decreased. Because common mode signals are undesirable, it is desirable to reduce the bandwidth of the amplifiers in the presence of common mode signals while maintaining or increasing bandwidth in the presence of differential signals. Therefore, a reduction in common mode transconductance, without reducing differential mode transconductance, is desirable because the bandwidth of the amplifiers in the presence of common mode signals is reduced while the bandwidth of the amplifiers in the presence of differential signals is maintained.

Figure 1A:
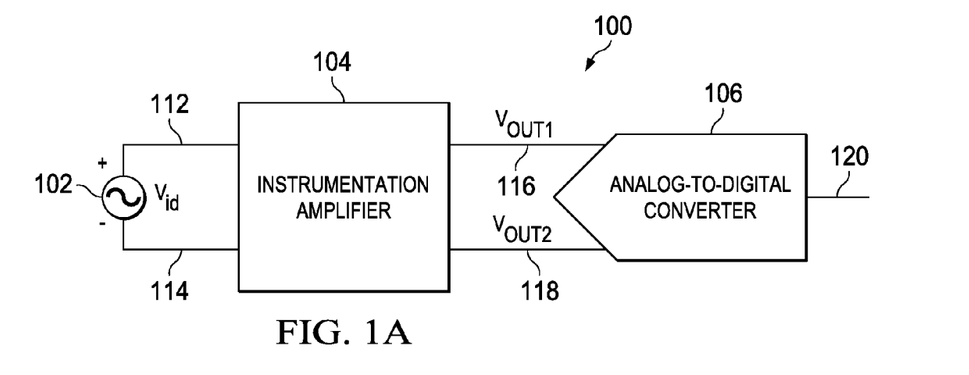
FIG. 1A shows a block diagram of an illustrative electrical system in the presence of differential signals in accordance with various embodiments.

FIG. 1A shows a block diagram of an illustrative electrical system 100 in the presence of differential signals in accordance with various embodiments. Electrical system 100 includes differential signal input 102, instrumentation amplifier (INA) 104, and analog-to-digital converter (ADC) 106. Differential signal input 102 is a differential pair of signals. Thus, differential signal input 102 produces a pair of the same signal, except that the two signals are 180 degrees out of phase with each other. Thus, a differential signal input 102 may produce a positive phase signal 112 and a negative phase signal 114 that are 180 degrees out of phase with each other as input for INA 104. In other words, positive phase signal 112 mirrors negative phase signal 114.

Figure 1B:
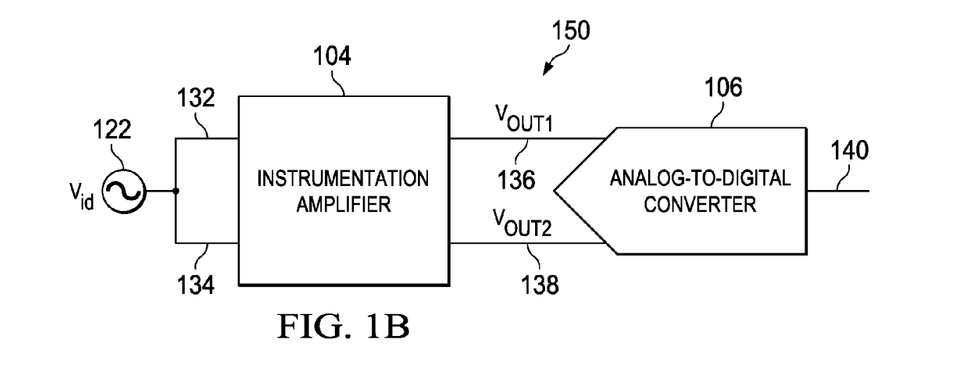
FIG. 1B shows a block diagram of an illustrative electrical system in the presence of common mode signals in accordance with various embodiments.

FIG. 1B shows a block diagram of an illustrative electrical system 150 in the presence of common mode signals accordance with various embodiments. Electrical system 150 includes common mode signal input 122, INA 104, and ADC 106. Common mode signal input 122 produces the same electrical signal on two wires in phase with one another. Thus, common mode signal input 122 produces common mode signals 132 and 134 in phase with one another as input for INA 104. Therefore, electrical system 150 is identical to electrical system 100 from FIG. 1A except that electrical system 150 is a system in the presence of common mode signals while electrical system 100 is a system in the presence of differential mode signals.

INA 104 is a differential amplifier that, when in the presence of differential signals as shown in FIG. 1A, is configured to increase the amplitude of differential signal input 102, including positive phase signal 112 and negative phase signal 114. Therefore, in an embodiment, INA 104 receives the positive phase signal 112 and negative phase signal 114 and amplifies those signals to an amplitude so as to maximize the dynamic range of ADC 106 and outputs amplified output signals 116 and 118. In other words, INA 104 amplifies the positive phase signal 112 and the negative phase signal 114 so as to maximize the number of bits utilized by the ADC 106 for sampling. Thus, the resolution of ADC 106 is improved. While the amplified output signals 116 and 118 are shown in FIG. 1A as being differential signals, INA 104 may also convert the differential signal to a single-ended signal prior to outputting the signal for processing by ADC 106.

When in the presence of common mode signals, as shown in FIG. 1B, INA 104 does not amplify the common mode signals 132 and 134. Additionally, bandwidth of INA 104 is decreased from the bandwidth of INA 104 in the presence of differential signal 102. By decreasing bandwidth of INA 104 in the presence of common mode signal 122, stability of INA 104 is increased.

When in the presence of differential signals, ADC 106 receives the amplified output signals 116 and 118 and converts the analog signals to a digital signal 120. Digital signal 120 may feed any type of device that requires or uses a digital signal. ADC 106 may be any type of electronic ADC including a direct-conversion ADC, a successive-approximation ADC, a ramp-compare ADC, an integrating ADC, a pipeline ADC, a sigma-delta ADC, a time-interleaved ADC, a delta-encoded ADC, a Wilkinson ADC, or any other type of ADC.

Figure 2A:
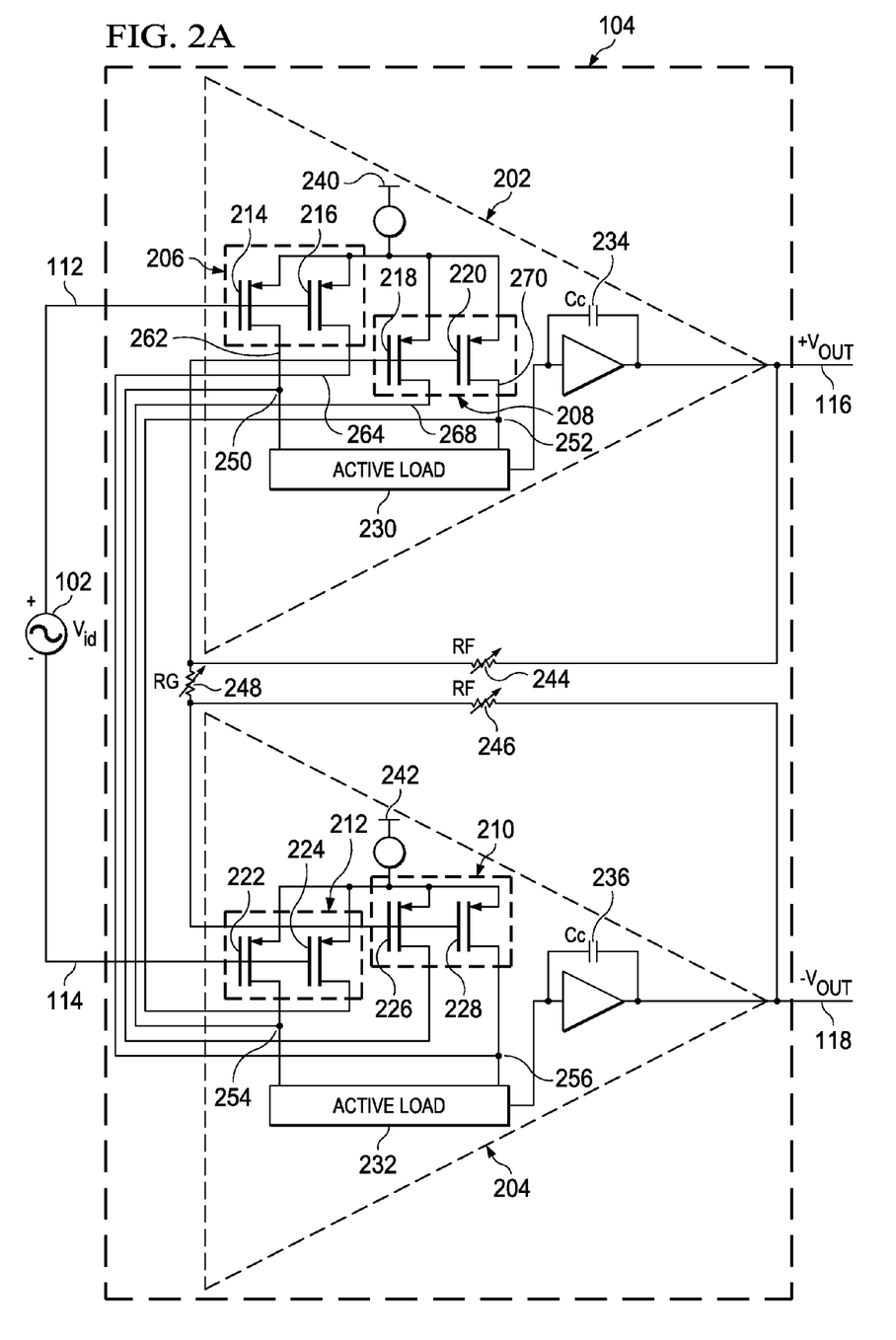
FIG. 2A shows a circuit diagram of an illustrative instrumentation amplifier (INA) in the presence of differential signals in accordance with various embodiments.
Figure 2B:
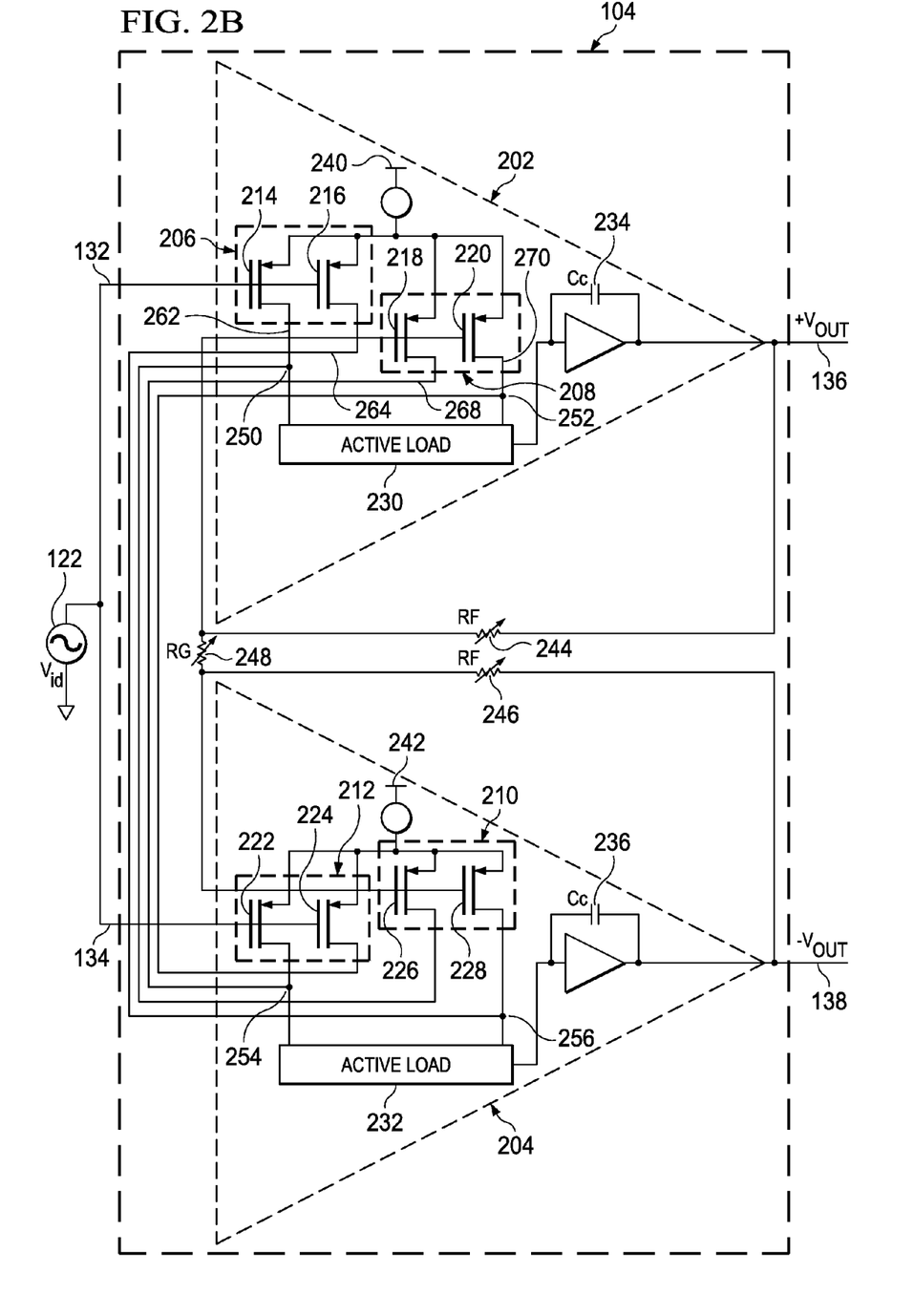
FIG. 2B shows a circuit diagram of an illustrative INA in the presence of common mode signals in accordance with various embodiments.

FIG. 2A shows a circuit diagram of INA 104 in the presence of differential signal 102 in accordance with various embodiments. FIG. 2B shows a circuit diagram of INA 104 in the presence of common mode signal 122 in accordance with various embodiments. INA 104 may include operational amplifiers 202 and 204, feedback resistors 244 and 246, and gain resistor 248. Feedback resistors 244 and 246 and gain resistor 248 may be adjustable so as to control the gain of INA 104.

Amplifiers 202 and 204 may be negative feedback amplifiers. Thus, in the presence of differential signal 102 as shown in FIG. 2A, amplifier 202 receives positive phase signal 112 as the non-inverting input while receiving a fraction of the output signal 116 of amplifier 202 as the inverting input due to the voltage divider created by the feedback network. The fraction of output signal 116 received by amplifier 202 as the inverting input depends on the amount of differential gain of amplifier 204. Amplifier 204 receives negative phase signal 114 as the non-inverting input while receiving output signal 118 of amplifier 204 as the inverting input.

In the presence of common mode signal 122 as shown in FIG. 2B, amplifier 202 receives signal 132 as the non-inverting input while receiving the output signal 136 of amplifier 202 as the inverting input. Amplifier 204 receives signal 134 as the non-inverting input while receiving output signal 138 of amplifier 204 as the inverting input. The inverting input is the entire output signal 138 because amplifier 204 has an effective gain of one in the presence of common mode signals.

Amplifier 202 may include transistors 206 and 208, an active load 230, and compensation capacitor 234. Amplifier 204 may include transistors 210 and 212, an active load 232, and compensation capacitor 236. Compensation capacitor 234 may be configured to set the compensation of amplifier 202 while compensation capacitor 236 may be configured to set the compensation of amplifier 204. Compensation is the rolling-off of the gain of an amplifier which results in a lower bandwidth amplifier while decompensation is to reduce or eliminate the compensation of the amplifier. In an embodiment, transistors 206-212 are FET transistors and more particularly may be PMOS transistors. In alternative embodiments, transistors 206-212 may be any other type of transistor including an n-channel metal-oxide-semiconductor field-effect (NMOS) transistor, a p-type junction gate field-effect transistor (PJFET), a n-type junction gate field-effect transistor (NJFET), and a bipolar junction transistor (BJT) (including PNP and NPN transistors). As MOSFET transistors, transistors 206-212 may include a gate, source, and drain. The biasing current 240 is received by the source of transistors 206-208 while biasing current 242 is received by the source of transistors 210-212.

The drain of transistor 206 in amplifier 202 is connected to, and in some embodiments directly connected to, the drain of transistor 210 in amplifier 204. The drain of transistor 208 in amplifier 202 is connected to, and in some embodiments directly connected to, the drain of transistor 212 in amplifier 204. The drains of transistors 206-208 are each connected to active load 230 as well. The drains of transistors 210-212 are each connected to active load 232 as well.

In the presence of differential signal 102, as shown in FIG. 2A, the gate of transistor 206 of amplifier 202 is connected to and receives positive phase signal 112. The gate of transistor 208 of amplifier 202 is connected to and receives the output signal 116 of amplifier 202. The gate of transistor 212 of amplifier 204 is connected to and receives negative phase signal 114. The gate of transistor 210 of amplifier 204 is connected to and receives output signal 118 of amplifier 204. In the presence of common mode signal 122, as shown in FIG. 2B, the gate of transistor 206 of amplifier 202 is connected to and receives signal 132. The gate of transistor 208 of amplifier 204 is connected to and receives the output signal 136 of amplifier 202. The gate of transistor 212 of amplifier 204 is connected to and receives signal 134. The gate of transistor 210 of amplifier 204 is connected to and receives output signal 138 of amplifier 204.

Each of transistors 206-212 may be split or folded into a first group of fingers and a second group of fingers. For example, transistor 206 may be split into finger groups 214 and 216. In other words, transistor 206 may be designed to include a multi-finger format, two groups of finger structures 214 and 216. Similarly, transistor 208 may be split into finger groups 218 and 220, transistor 210 may be split into finger groups 226 and 228, and transistor 212 may be split into finger groups 222 and 224.

The finger groups 214 and 216 may be split such that the area of the finger groups combined equal to the area of transistor 206, if it were not split or in a conventional configuration of an INA. For example, if the area of transistor 206 is 256x without being split into fingers or in a conventional INA, then the area of finger group 214 may be 129x while the area of finger group 216 may be 127x. Similarly, finger groups 218 and 220 may be split such that the area of the finger groups combined equal to the area of transistor 208, if it were not split or in a conventional INA. Finger groups 222 and 224 may be split such that the area of the finger groups combined equal to the area of transistor 212, if it were not split or in a conventional INA. Finger groups 226 and 228 may be split such that the area of the finger groups combined equal to the area of transistor 210, if it were not split or in a conventional INA.

Each of the finger groups 214-228 may have a drain and a source. In alternative embodiments, each finger within finger groups 214-228 has a drain and source. The drain or drains of finger group 214 of transistor 206 is connected, and in some embodiments directly connected, to the drain or drains of finger group 226 of transistor 210 via connection 262. The drain or drains of finger group 216 of transistor 206 is connected, and in some embodiments directly connected, to the drain or drains of finger group 228 of transistor 210 via connection 264. The drain or drains of finger group 218 of transistor 208 is connected, and in some embodiments directly connected, to the drain or drains of finger group 222 of transistor 212 via connection 268. The drain or drains of finger group 220 of transistor 208 is connected, and in some embodiments directly connected, to the drain or drains of finger group 224 of transistor 212 via connection 270.

Because of the split in each of the transistors 206-212, transconductance may be lowered compared to a conventional INA in the presence of common mode signals while transconductance is maintained in the presence of differential signals. In the following example, the area of finger groups 214, 220, 222, and 228 are each 129x while the area of finger groups 216, 218, 224, and 226 are each 127x while the area of transistors of a conventional INA are 256x. In the presence of differential signals, as shown in FIG. 2A, node 250 is fed by a negative phase signal from finger group 214 while also being fed by a negative phase signal from finger group 226. The combined area of the MOS is 256x. Similarly, node 256 is fed by a negative phase signal from finger groups 216 and 228 having a combined area of the MOS of 256x. Node 252 is fed by a positive phase signal from finger groups 218 and 224 having a combined area of the MOS of 256x. Node 254 is fed by a positive phase signal from finger groups 218 and 222 having a combined area of the MOS of 256x. Because the area of the combined finger groups equals the area of a transistor of a conventional INA, the transconductance in the differential mode ($GM_D$ being directly proportional to the area of the transistors) is unaffected compared to a conventional INA. Therefore, bandwidth in the differential mode is also maintained (bandwidth being directly proportional to the transconductance).

However, in the presence of common mode signals, as shown in FIG. 2B, node 250 is fed by a negative phase signal from finger group 214 while being fed by a positive phase signal from finger group 226. Because of the phase difference from the two signals feeding node 250, the area from finger group 226 of 127x is subtracted from the area of finger group 214 of 129x as the signal from finger group 214 is cancelled by the signal from finger group 226. Therefore, the area of the combined MOS is equivalent to 2x. Similarly, node 256 is fed by a negative phase signal from finger group 216 and a positive phase signal from finger group 228 leaving a combined area of the MOS equivalent to 2x. Node 252 is fed by a positive phase signal from finger group 218 and a negative phase signal from finger group 224 leaving a combined area of the MOS equivalent to 2x. Node 254 is fed by a positive phase signal from finger groups 218 and a negative phase signal from finger group 222 leaving a combined area of the MOS equivalent to 2x. Because the area of the combined finger groups is less than the area of a conventional INA, the transconductance in the common mode ($GM_C$ being directly proportional to the area of the transistors) is reduced compared to a conventional INA. Therefore, bandwidth in the common mode is also reduced (bandwidth being directly proportional to the transconductance) while the area of the transistors is maintained.

Figure 3:
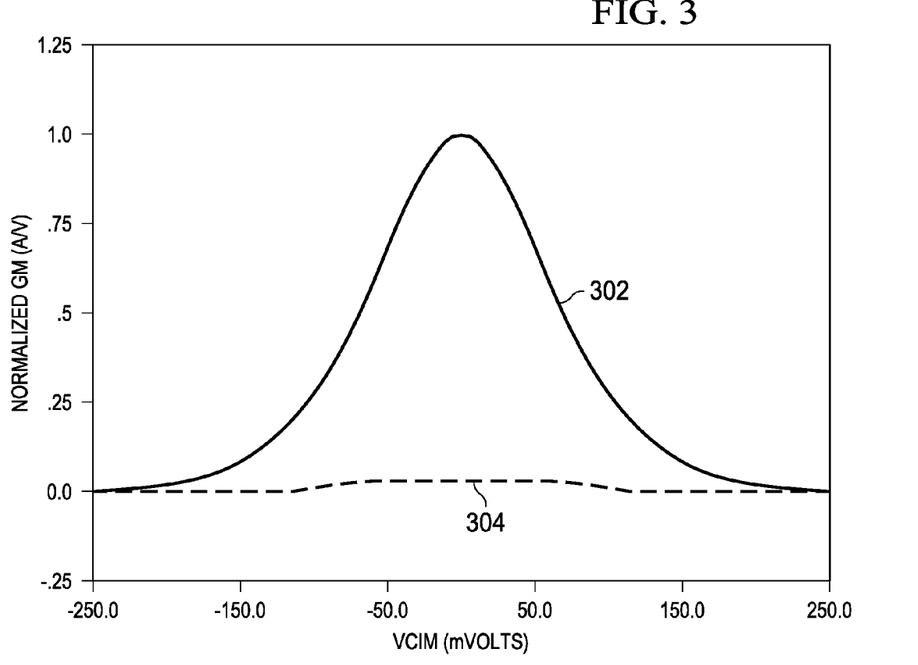
FIG. 3 shows an example transconductance versus input common mode voltage curve utilizing an example INA as compared to transconductance versus input common mode voltage curve utilizing a conventional INA in accordance with various embodiments.

FIG. 3 shows two curves 302 and 304 of transconductance versus input common mode voltage. Curve 302 shows an example of the normalized transconductance of a conventional INA in the presence of common mode signals. As the common mode signal 122 increases, transconductance increases until, in this example, it reaches 1 A/V. Transconductance then begins to decrease.

Curve 304 utilizes INA 104 as described above. Curve 304 shows an example of the normalized transconductance of INA 104 in the presence of common mode signals. Like curve 302, transconductance increases as the common mode signal 122 increases. However, transconductance is limited to a fraction of the transconductance found in the conventional INA. In this example, the normalized transconductance only reaches a maximum of 7.8125 mA/V in INA 104 which is a transconductance reduction of 128 times as compared to the transconductance found in the conventional INA.

Figure 4:
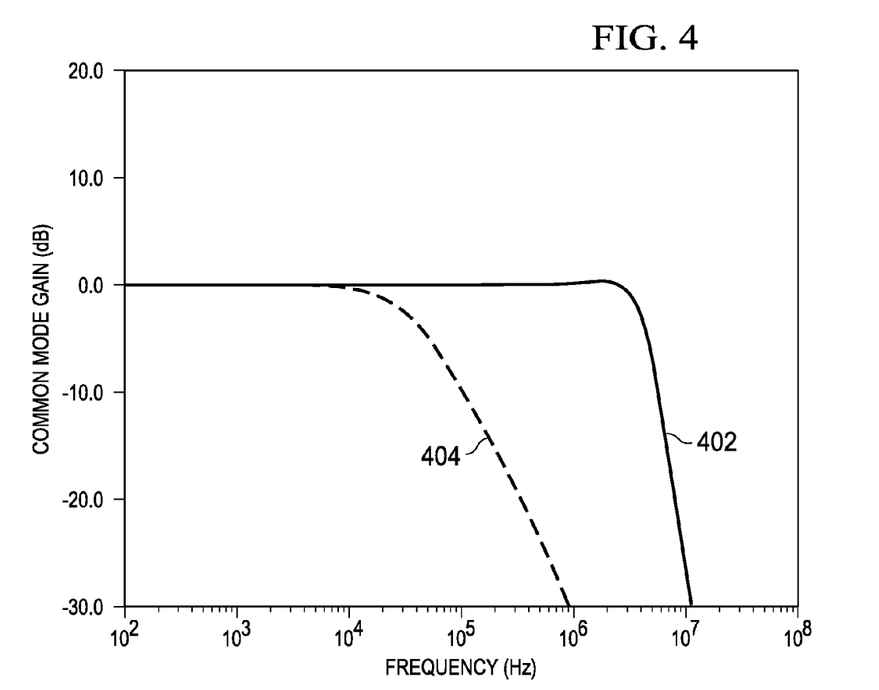
FIG. 4 shows an example common mode gain versus frequency curve utilizing an example INA as compared to a common mode gain versus frequency curve utilizing a conventional INA in accordance with various embodiments.

FIG. 4 shows an example common mode gain versus frequency curve 404 utilizing an example INA as compared to a common mode gain versus frequency curve 402 utilizing a conventional INA in accordance with various embodiments. Curve 402 shows an example of the gain of a conventional INA in the presence of common mode signals while curve 404 shows an example of the gain of INA 104 in the presence of common mode signals. As the frequency of common mode signal 122 increases, the common mode gain eventually begins to drop rapidly. However, as shown in curve 404, the common mode gain begins to drop at a much lower frequency for INA 104 versus a conventional INA. In fact, in the example shown in FIG. 4, there is a 128 times reduction in bandwidth for INA 104 versus the conventional INA in the presence of common mode signals.

Figure 5:
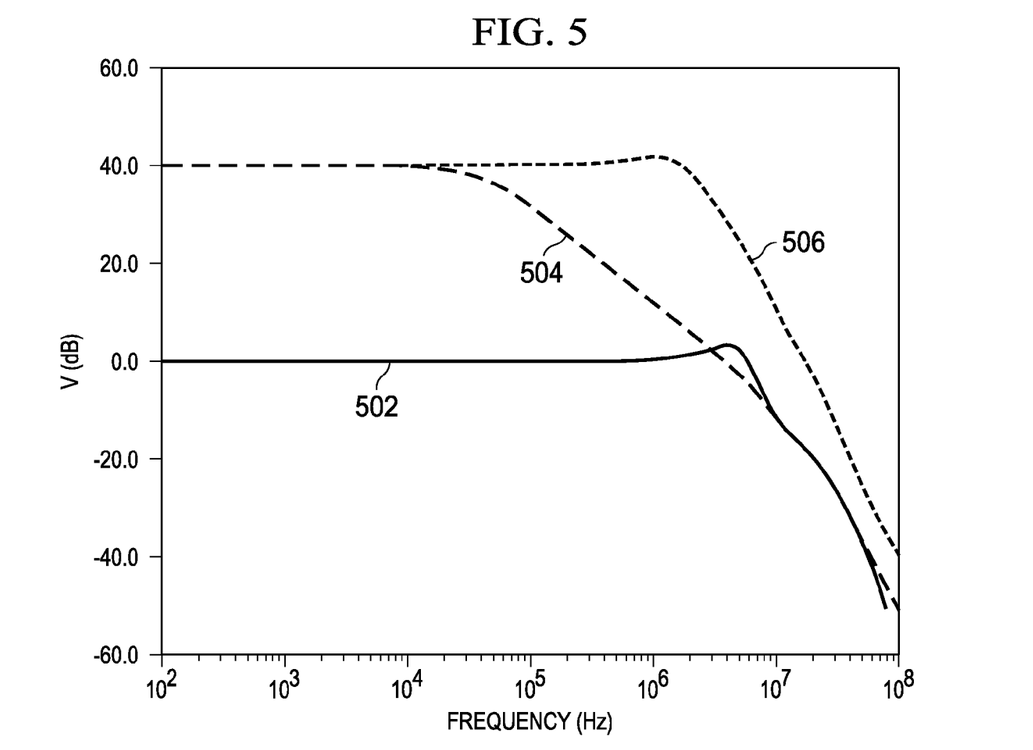
FIG. 5 shows example differential gain versus frequency curves in accordance with various embodiments.

FIG. 5 shows example differential gain versus frequency curves 502-506 in accordance with various embodiments. Curve 502 shows an example of the gain versus frequency of INA 104 in the presence of differential signals for a compensated signal. For curve 502, the gain is 1 V/V. Curve 504 shows an example of the gain versus frequency of INA 104 in the presence of differential signals for a compensated signal with a gain of 100 V/V. Curve 506 shows an example of the gain versus frequency of INA 104 in the presence of differential signals for a decompensated signal with a gain of 100 V/V. Curve 506 shows that a decompensated differential signal in INA 104 is able to achieve a bandwidth increase, and in the example shown, an increase in bandwidth of almost 2 orders of magnitude for a gain of 100 V/V over a compensated differential signal. Thus, bandwidth is able to increase in INA 104 based on decompensation in the presence of differential signals while bandwidth is decreased, as shown in FIG. 4, in the presence of common mode signals.

Figure 6:
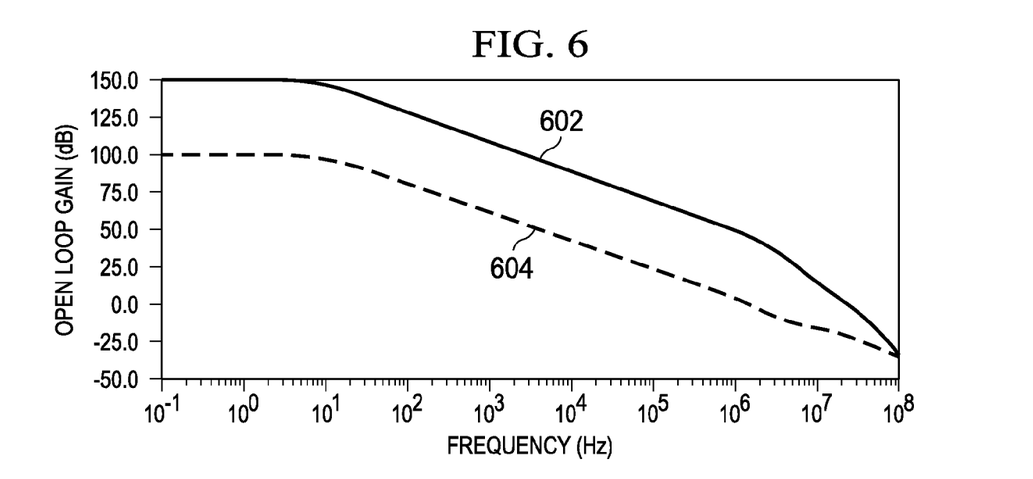
FIG. 6 shows an example common mode open loop gain versus frequency curve utilizing an example INA as compared to a common mode open loop gain versus frequency curve utilizing a conventional INA in accordance with various embodiments.

FIG. 6 shows an example common mode open loop gain versus frequency curve 604 utilizing an example INA as compared to a common mode open loop gain versus frequency curve 602 utilizing a conventional INA in accordance with various embodiments. Curve 602 shows an example of the open loop gain in dB of common mode signals for a conventional INA. Curve 604 shows an example of the open loop gain in dB of common mode signals for INA 104. In order to determine phase margin, and thus stability, in a feedback system, it is necessary to determine the frequency of the open loop gain at which the gain is 1 V/V or 0 dB. Comparing, curve 602 to curve 604 shows that the frequency for which the open loop gain at which the gain is 0 dB in curve 604, and thus INA 104, is much lower than the frequency for which the open loop gain at which the gain is 0 dB in curve 602, and thus the conventional INA. This reduction in frequency, as shown in FIG. 7, translates into a phase margin increase.

Figure 7:
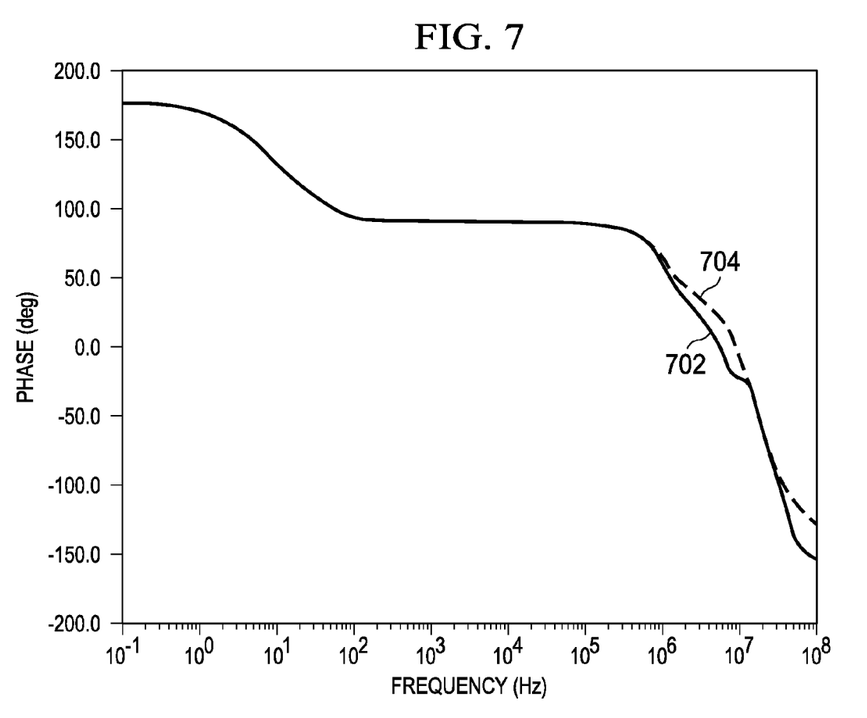
FIG. 7 shows an example common mode open loop phase versus frequency curve utilizing an example INA as compared to a common mode open loop phase versus frequency curve utilizing a conventional INA in accordance with various embodiments.

FIG. 7 shows an example common mode open loop phase versus frequency curve 704 utilizing an example INA as compared to a common mode open loop phase versus frequency curve 702 utilizing a conventional INA in accordance with various embodiments. Curve 702 shows an example of the open loop phase of common mode signals for a conventional INA. Curve 704 shows an example of the open loop phase of common mode signals for INA 104. Curve 702 shows that the common mode signals for a conventional INA may have a phase margin of −58 degrees while curve 704 shows that the common mode signals for INA 704 may have a phase margin of 50 degrees. Thus, INA 104 provides increased stability as compared to a conventional INA because phase margin is maintained in INA 104 while phase margin decreases in the conventional INA.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An instrumentation amplifier (INA), comprising:
   a first amplifier comprising a first transistor, the first amplifier configured to receive a positive phase signal of a differential signal; and
   a second amplifier comprising a second transistor, the second amplifier coupled to the first amplifier and configured to receive a negative phase signal of the differential signal;
   wherein the first and second transistors each comprise a gate, source, and drain; and
   wherein the first transistor drain is connected to the second transistor drain.

2. The INA of claim 1, wherein the first amplifier comprises a third transistor including a gate, source, and drain;

wherein the second amplifier comprises a fourth transistor including a gate, source, and drain; and wherein the third transistor drain is connected to the fourth transistor drain.

3. The INA of claim 1, wherein the first transistor comprises a first plurality of fingers and a second plurality of fingers and the second transistor comprises a third plurality of fingers and a fourth plurality of fingers, wherein the first, second, third, and fourth plurality of fingers each comprises a drain.

4. The INA of claim 3, wherein the first plurality of fingers drain is connected to the third plurality of fingers drain and the second plurality of fingers drain is connected to the fourth plurality of fingers drain.

5. The INA of claim 4, wherein the first plurality of fingers comprises more fingers than the second plurality of fingers and the fourth plurality of fingers comprises more fingers than the third plurality of fingers.

6. The INA of claim 1, wherein the first and second transistors are p-channel metal-oxide-semiconductor field-effect (PMOS) transistors.

7. The INA of claim 1, wherein the first and second amplifiers are further configured to receive a common mode signal.

8. The INA of claim 1, further comprising a gain resistor coupled to the first and second amplifiers, and wherein the first amplifier further comprises a first compensation capacitor and the second amplifier further comprises a second compensation capacitor.

9. A system comprising:

an instrumentation amplifier (INA) configured to receive a common mode signal, the INA comprising:

a first amplifier that includes a first field effect transistor (FET) comprising a gate, source, and drain; and a second amplifier that includes a second FET comprising a gate, source, and drain, the system further comprising:

an analog-to-digital converter (ADC) coupled to the INA, the ADC configured to receive an output signal of the INA;

wherein the first FET drain is connected to the second FET drain.

10. The system of claim 9, wherein the first amplifier further includes a third FET and the second amplifier further includes a fourth FET, the third and fourth FETs each comprising a gate source, and drain.

11. The system of claim 10, wherein the third FET drain is connected to the fourth FET drain.

12. The system of claim 11, wherein the first FET comprises a first and second plurality of fingers, the second FET comprises a third and fourth plurality of fingers, the third FET comprises a fifth and sixth plurality of fingers, and the fourth FET comprises a seventh and eighth plurality of fingers, wherein the first, second, third, fourth, fifth, sixth, seventh, and eighth plurality of fingers each include a drain.

13. The system of claim 12, wherein the first plurality of fingers drain is connected to the third plurality of fingers drain and the second plurality of fingers drain is connected to the fourth plurality of fingers drain, the fifth plurality of fingers drain is connected to the seventh plurality of fingers drain, and the sixth plurality of fingers drain is connected to the eighth plurality of fingers drain.

14. The system of claim 13, wherein the first plurality of fingers includes more fingers than the third plurality of fingers, the second plurality of fingers includes less fingers than the fourth plurality of fingers, the fifth plurality of fingers includes less fingers than the seventh plurality of fingers, and the sixth plurality of fingers comprises more fingers than the eighth plurality of fingers.

15. The system of claim 13, wherein the first, fourth, sixth, and seventh plurality of fingers include the same number of fingers, and wherein the second, third, fifth, and eighth plurality of fingers include the same number of fingers.

16. The system of claim 15, wherein the number of fingers in the first, fourth, sixth, and seventh plurality of fingers is greater than the number of fingers for the second, third, fifth, and eighth plurality of fingers.

17. The system of claim 9, wherein the INA is further configured to receive a differential signal including a positive phase signal and a negative phase signal.

18. An instrumentation amplifier (INA) comprising:

a first operational amplifier comprising a first p-channel metal-oxide-semiconductor field-effect (PMOS) transistor, a second PMOS transistor, and a first compensation capacitor, the first operational amplifier configured to receive a common mode signal;

a second operational amplifier coupled to the first operational amplifier, the second operational amplifier comprising a third PMOS transistor, a fourth PMOS transistor, and a second compensation capacitor;

a gain resistor coupled to the first and second operational amplifiers; and a plurality of feedback resistors coupled to the first and second operational amplifiers and the gain resistor, wherein the first PMOS transistor drain is connected to the third PMOS transistor drain and the second PMOS transistor drain is connected to the fourth PMOS transistor drain.

19. The INA of claim 18, wherein the first PMOS transistor comprises a first and second plurality of fingers, the second PMOS transistor comprises a third and fourth plurality of fingers, the third PMOS transistor comprises a fifth and sixth plurality of fingers, and the fourth PMOS transistor comprises a seventh and eighth plurality of fingers.

20. The INA of claim 19, wherein the first plurality of fingers drain is connected to the fifth plurality of fingers drain and the second plurality of fingers drain is connected to the sixth plurality of fingers drain.

\* \* \* \* \*